United States Patent
Schmidt et al.

[11] Patent Number: 5,988,511
[45] Date of Patent: Nov. 23, 1999

[54] STACKABLE DATA CARRIER THAT CAN BE OPERATED ON A DATA BUS

[75] Inventors: Helge Schmidt, Speyer; Peter Preiner, München, both of Germany; Georges Embo, Langemark, Belgium

[73] Assignee: Siemens Aktiengesellschaft, Munich, Germany

[21] Appl. No.: 08/999,032

[22] Filed: Dec. 29, 1997

Related U.S. Application Data

[63] Continuation of application No. PCT/DE96/01110, Jun. 24, 1996.

[30] Foreign Application Priority Data

Jun. 29, 1995 [DE] Germany ............................ 195 23 793

[51] Int. Cl.⁶ ............................ G06K 19/06; H01R 9/09; H01R 9/22
[52] U.S. Cl. ............................ 235/492; 439/74; 439/717
[58] Field of Search .................................... 235/492, 486; 361/790; 439/70, 74, 69, 701, 717

[56] References Cited

U.S. PATENT DOCUMENTS

| | | | |
|---|---|---|---|
| 4,171,862 | 10/1979 | Krasser | 339/198 H |
| 4,184,733 | 1/1980 | Schmeling | 339/198 H |
| 4,695,116 | 9/1987 | Bailey et al. | 439/188 |
| 4,696,525 | 9/1987 | Coller et al. | 439/69 |
| 4,872,843 | 10/1989 | Anstey | 439/69 |
| 5,176,523 | 1/1993 | Lai | 439/64 |
| 5,288,251 | 2/1994 | Sumida | 439/701 |
| 5,375,037 | 12/1994 | Le Roux | 361/684 |
| 5,486,687 | 1/1996 | Le Roux | 235/382 |
| 5,570,504 | 11/1996 | DiStefano et al. | 29/830 |
| 5,884,319 | 3/1999 | Hafner et al. | 707/104 |

*Primary Examiner*—Donald Hajec
*Assistant Examiner*—Daniel Sherr
*Attorney, Agent, or Firm*—Herbert L. Lerner; Laurence A. Greenberg

[57] ABSTRACT

Stackable and portable data carriers, with non-volatile semiconductor memories have contact faces on their surfaces. When such data carriers are stacked on top of one another they electrically contact the respectively adjacent data carriers and a bus system at the same time. The contour of the data carriers is embodied such that, when neighboring data carriers of the same kind rest on one another, the data carrier are interlaced in a form and force lock to a mechanically fixed, but detachable composite unit. At the same time, the respectively adjacent data carriers of the composite unit come into resilient contact with one another via their respective contact faces.

10 Claims, 4 Drawing Sheets

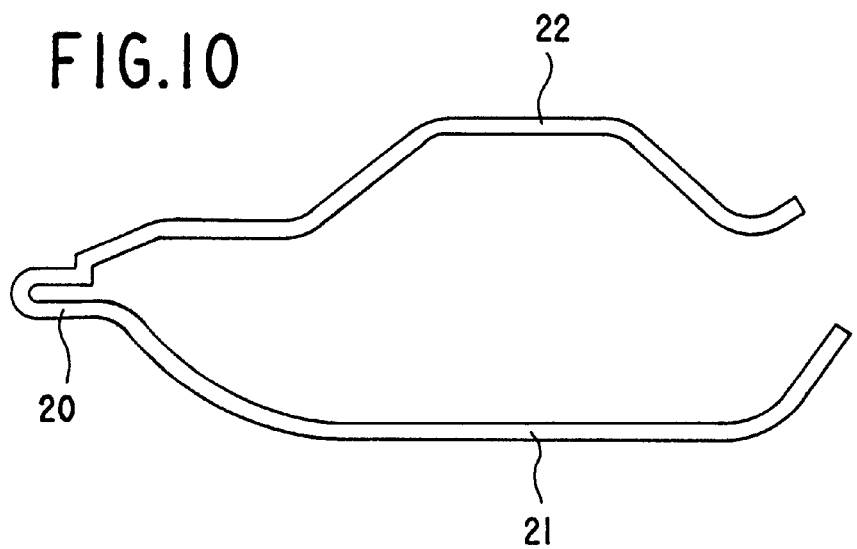
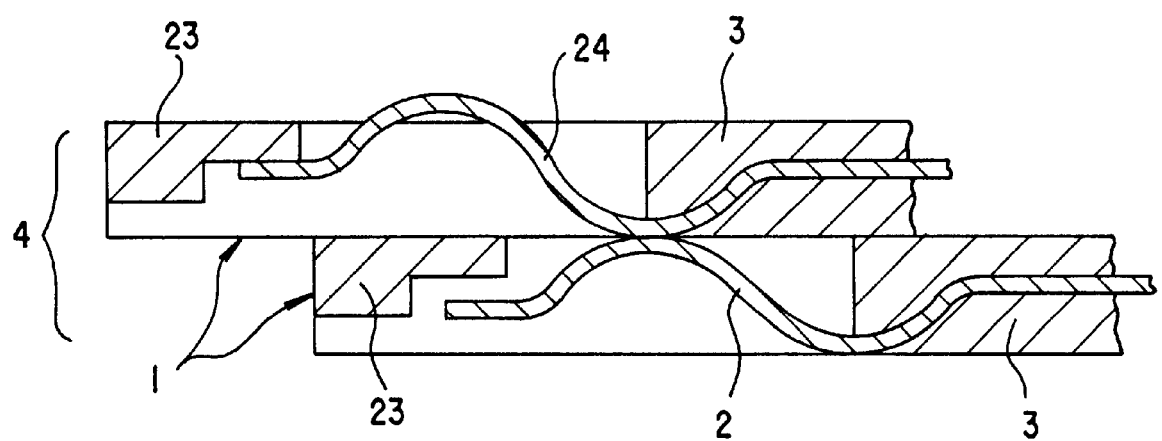

STACKABLE DATA CARRIER THAT CAN BE OPERATED ON A DATA BUS

CROSS-REFERENCE TO RELATED APPLICATION

This is a continuation of copending international application PCT/DE96/01110, filed Jun. 24, 1996, which designated the United States.

BACKGROUND OF THE INVENTION

1. Field of the Invention

The invention pertains to stackable and portable data carriers including a card-shaped carrier element, on which there are disposed at least one electrically programmable, non-volatile semiconductor memory and at least one external connection of the data carrier that is electrically connected to the memory. The external connection has contact faces disposed on the surfaces of the data carrier in such a way that when data carriers of the same kind are resting on one another, they electrically contact the respective neighboring data carriers and a bus system at the same time.

Data carriers with standardized dimensions have been known in the art generally as chip cards. Conventional chip cards contain semiconductor elements with relatively small storage capacity and a logic circuit in the foreground. With the increasing availability of semiconductor memories that can be inexpensively produced and that have a storage capacity at least in the megabyte range, comes the desire to rapidly and easily access a large number of data carriers of the same kind with the greatest possible storage capacity. These data carriers are intended, for example, for digitized music signals, image signals received by an electronic camera, texts (such as entire dictionaries), electronic maps, software for data processing systems, etc. The semiconductors can be writable and erasable memories or read-only memories (ROM). The data are preferably stored in a compressed format with regard to their redundancy.

2. Description of the Related Art

Commonly owned, copending application Ser. No. 08/828,697, filed Mar. 31, 1997 (publ. WO 96/10804), which is here incorporated by reference, describes a stackable data carrier of the above-mentioned kind. There, the contact faces should preferably be disposed running flush around one of the edge faces of the carrier element. As a result, a number of these cards can be easily stacked one on top of the other so that a large number of data carriers of the same kind can be simultaneously connected to a processing device without an expensive additional device. Connection faces that run flush around an edge achieve a direct reciprocal contacting of the cards stacked on top of each other without a contact rail. Mention is also made of a loosely manageable connecting socket that secures the stacked data carrier cards in a mechanically fixed composite unit.

The corresponding connections, which are directly or indirectly connected to one another and belong to a number of cards disposed one on top of the other, function logically as a data bus so that all of the data carriers of the stack are simultaneously connected on-line the moment even one of the stacked data carriers is connected to the device.

The copending application further proposes, in connection with the possibility of combining a number of mutually stacked data carrier cards in a connecting piece or in a housing, positioning means which force the chip cards as precisely on top of one another as possible and, as a result, assure an exact overlapping of their connections. These positioning means include at least one projection on a main face of the carrier element and a corresponding recess on the opposite main face, which can receive the projection of another data carrier. The knob-like projections disclosed there, however, particularly due to insufficient elasticity, are not suited to assure a durable fixing of the stacked data carriers even with the exertion of external force. Furthermore, even with an exact overlap of the connections, no assurance of sufficient contact force or a tolerance compensation in the stacking direction between the different connection contact points is made.

SUMMARY OF THE INVENTION

It is accordingly an object of the invention to provide a stackable data carrier operable on a databus, which overcomes the above-mentioned disadvantages of the heretofore-known devices and methods of this general type and which can be stacked with other data carriers of the same kind in a durable manner with reliable electrical function, and which remains in an independent stack with a fixed contour even under the influence of a moderate exertion of external force.

With the foregoing and other objects in view there is provided, in accordance with the invention, a stackable and portable data carrier, comprising:

- a card-shaped carrier element carrying at least one electrically programmable, non-volatile semiconductor memory and at least one external connector electrically connected to the memory;
- the external connector having contact faces disposed on external surfaces of the carrier element such that when respective, substantially identical data carriers rest on one another, the contact faces electrically contact the contact faces of adjacent data carriers;
- the carrier element defining a contour of the data carrier which effects a form-lock with adjacent data carriers when a plurality of substantially identical data carriers are stacked on one another, and wherein the data carriers are stackable into a mechanically fixed, but detachable composite unit whereby respectively adjacent data carriers of the composite unit come into contact with one another via the respective contact faces.

In other words, the objects of the invention are attained in that the contour of the data carrier is embodied so that when stacked, the contours of neighboring data carriers of the same kind can be interlaced in a locking manner and the data carriers can be stacked into a mechanically fixed, but detachable composite unit. At the same time, the respective neighboring data carriers of the composite unit come into contact with one another via their respective contact faces.

In accordance with an added feature of the invention, the carrier element defines two main faces of the data carrier, and wherein the two main faces have a complementary shape such that mutually adjacent data carriers can be snapped together.

In accordance with an additional feature of the invention, the contact faces resiliently cooperate with the contact faces of respectively adjacent the data carriers when a plurality of data carriers are assembled into the composite unit.

In accordance with another feature of the invention, the contact faces effect the electrical contact with adjacent data carriers and at least a part of a mechanical frictional lock with the adjacent data carrier.

In accordance with a further feature of the invention, the carrier element defines two main faces of the data carrier, and wherein one of the main faces is formed with dovetail guides for locking with an adjacent data carrier.

In accordance with again an added feature of the invention, one of the main faces is formed with a projection and the other of the main faces is formed with a complementary recess for receiving a projection of an adjacent data carrier, the contact faces being disposed on at least a part of the projection on at least a part of a surface defining the recess.

In accordance with again another feature of the invention, the carrier element is formed with indentations on an edge face thereof for facilitating detachment of the individual data carrier from the composite unit.

In accordance with yet another feature of the invention, the at least one semiconductor memory is one of two semiconductor circuits disposed in two planes above each other within the carrier element, the semiconductor circuits being collectively connected to the contact faces.

With the above and other objects in view there is also provided, in accordance with the invention, a composite unit of a plurality of stacked data carriers, comprising:

a plurality of data carriers forming at least two groups of data carriers, each data carrier including a card-shaped carrier element carrying at least one electrically programmable, non-volatile semiconductor memory and at least one external connector electrically connected to the memory;

the external connector of each of the data carriers having contact faces disposed on external surfaces of the carrier element such that when respective data carriers rest on one another, the contact faces electrically contact the contact faces of adjacent data carriers;

the carrier element of each of the data carriers defining a contour of the data carriers which effects a form-lock with adjacent data carriers;

a coupling card having a contour substantially identical to the contour of the data carriers and being disposed between the at least two groups of data carriers;

the contact faces within each of the groups of data carriers being connected to one another and the coupling card connecting the contact faces adjacent groups of data carriers to one another.

In accordance with a concomitant feature of the invention, there is provided a packing structure closing off the composite unit towards at least one side thereof, the packing structure having a contour towards an adjacent the data carrier which is complementary to the contour of the data carrier.

The invention is thus built on the premise that the contour of the individual data carriers effects a mechanically stable, self-locking interlock of a partial face with a corresponding, complementary face of an adjacent data carrier. This interaction may be referred to as snap connection (snap-on or snap-in), interlacing, or press-fit one into the other. Besides a force-lock, the contact force necessary for the electrical contact must be achieved at the same time, at least at the electroplated contact points of the directly adjoining data carriers. The latter can in particular be achieved by virtue of the above-noted feature in that the contact faces are embodied and disposed so that they cooperate in a resilient manner when the data carriers are assembled. This resilient embodiment of the contact faces can naturally also be employed to assure the contact force even in data carriers that can be assembled into a composite unit in a manner other than by snapping or interlacing of partial faces and also in data carriers that are only stacked loosely.

A particularly advantageous improvement of the invention is found in the fact that the contact faces themselves are embodied and disposed such that they simultaneously produce the contact and at least a part of the mechanical frictional, force-locking engagement when the data carriers are assembled.

Other features which are considered as characteristic for the invention are set forth in the appended claims.

Although the invention is illustrated and described herein as embodied in a stackable data carrier that can be operated on a data bus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 10 is a side view thereof; and

FIG. 11 is a sectional side view showing the mutual contacting of two contact elements.

DESCRIPTION OF THE PREFERRED EMBODIMENTS

Figure 1:
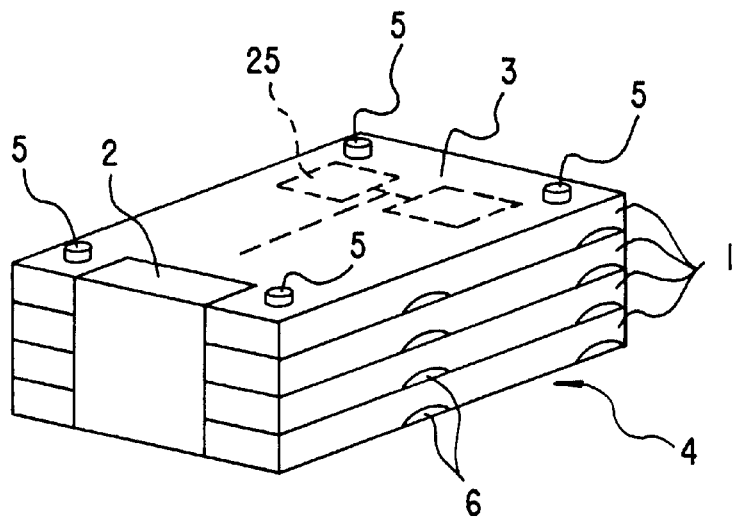
FIG. 1 is a perspective view of a stack comprised of four data carriers.

Referring now to the figures of the drawing in detail and first, particularly, to FIG. 1 thereof, there is seen a stack of four data carriers 1 which are electrically connected to one another by means of their contact faces 2 that run flush around a lateral edge. The card-shaped carrier elements 3 are preferably formed of electrically insulating plastic material. As diagrammatically indicated, various integrated semiconductor circuits 25 are disposed in recesses of the carrier element 3 or completely enclosed by the material of the carrier element 3 (cf. FIG. 3). The mechanically fixed, but detachable assembly of the individual data carriers 1 into a composite unit 4 is carried out in the embodiment according to FIG. 1 in accordance with the LEGO principle, wherein the pluggable projections 5 shown, which cooperate with complementary recesses on the undersides of the data carriers 1, each must have a sufficient inherent elasticity (spring action) and size in order to be able to fulfill this function. The cavities 6 that are incorporated into at least one edge face of the data carrier 1 are also schematically represented and permit the four data carriers 1 of the composite unit 4 to be detached.

Figure 2:
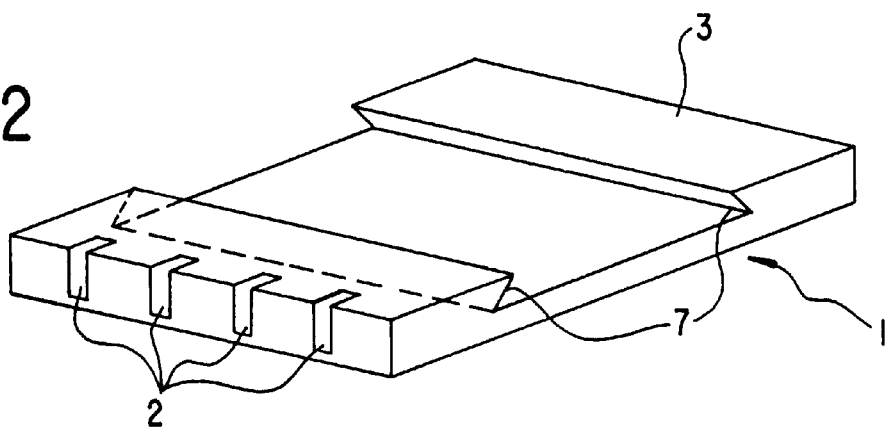
FIG. 2 is a perspective view of an individual data carrier of a second embodiment.

Referring now to FIG. 2, the individual data carriers can be fixed or stacked in a series so that the mechanically frictional, non-positive engagement is produced at least in part by means of dovetail guides 7 disposed on at least one of the main faces of the data carrier. As is common with dovetail guides, the individual data carriers are slid into one another. If the dovetail is not deep, a snap-in connection can also be achieved by bending. Generally, in this embodiment and in others, the dovetail can also be embodied in the longitudinal direction of the data carrier card. In a non-illustrated embodiment, a dovetail guide is provided in the lateral direction on both main faces at one end of the data carrier, while for example square projections and opposite them, square recesses are disposed in the corners at the other end. The assembly is achieved by virtue of the fact that the complementary dovetail guides of two data carriers are first brought loosely into engagement and then the data carriers are snapped together by means of pressing the two data carriers against each other at the other end. By pulling the latter ends apart, the data carriers can be unsnapped and detached.

Figure 3:
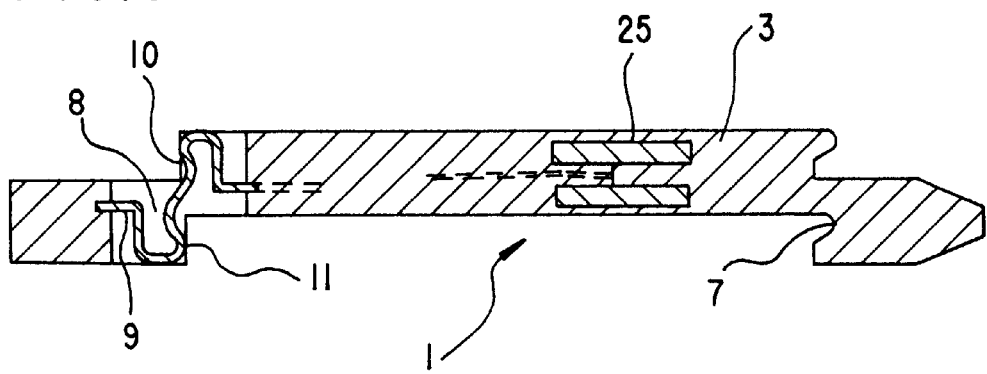
FIG. 3 is a sectional elevational view of a single data carrier of a third embodiment.
Figure 4:
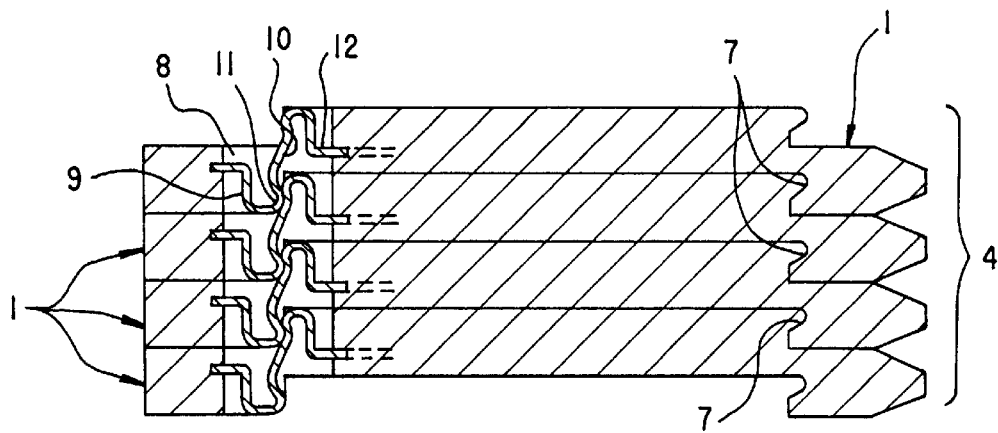
FIG. 4 is a sectional elevational view of a stack of four data carriers of the third embodiment.
Figure 5:
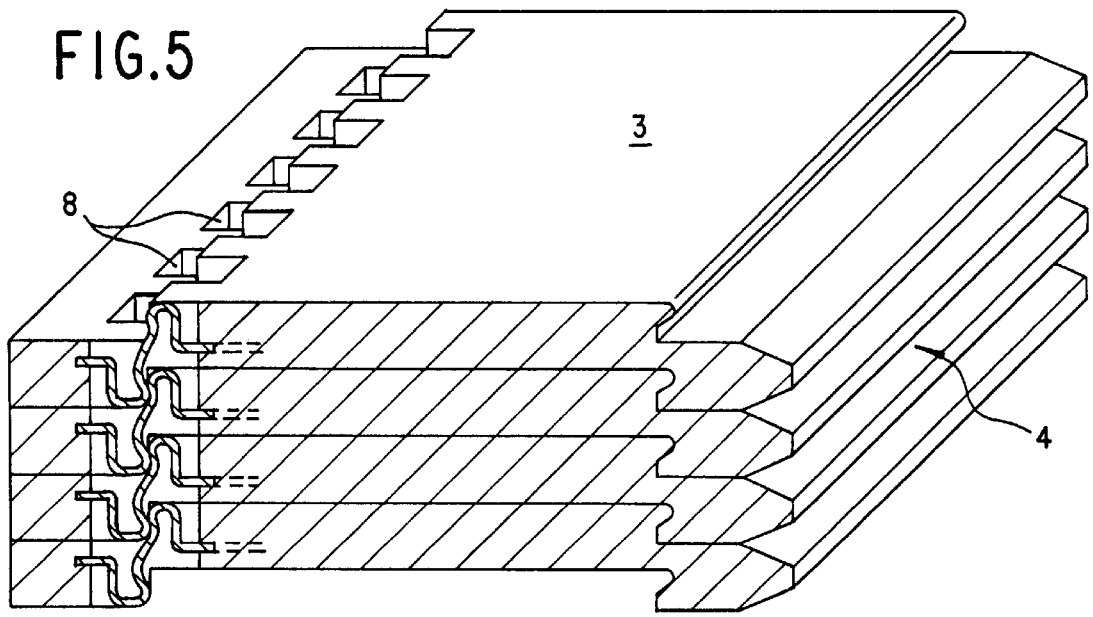
FIG. 5 is a top-perspective, sectional view thereof.

FIGS. 3 to 5 show an embodiment in which two neighboring data carriers 1 engage one another lateral to the longitudinal direction on one end, for example by means of a conventional dovetail guide 7, while on the opposite end, an S-shaped contact spring 9 is provided in an opening 8 of the carrier element 3. The upper part 10 of the contact spring 9 can cooperate with the bottom part 11 of a superposed contact spring 12 of a neighboring data carrier 1 in accordance with the dovetail principle. The elastic cooperation of the contact springs 9, 12 thus assures the frictional, non-positive engagement and a fixed connection of these ends of the data carrier 1 so that a high contact force there is produced at the same time.

Figure 6:
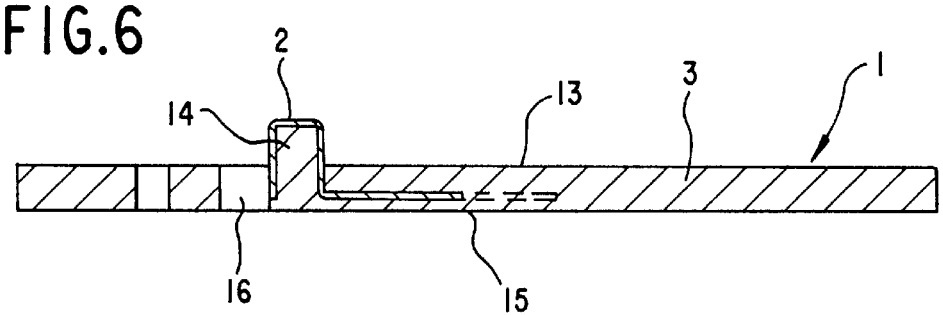
FIG. 6 is a sectional elevational view of a single data carrier of a fourth embodiment.
Figure 7:
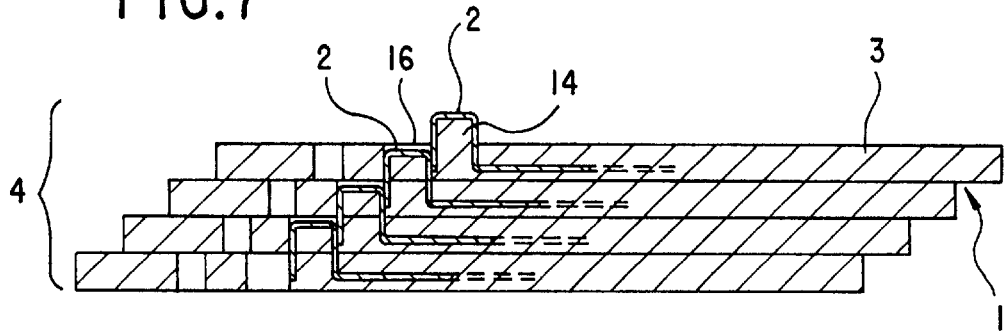
FIG. 7 is a sectional elevational view of four mutually stacked data carriers of the fourth embodiment.
Figure 8:
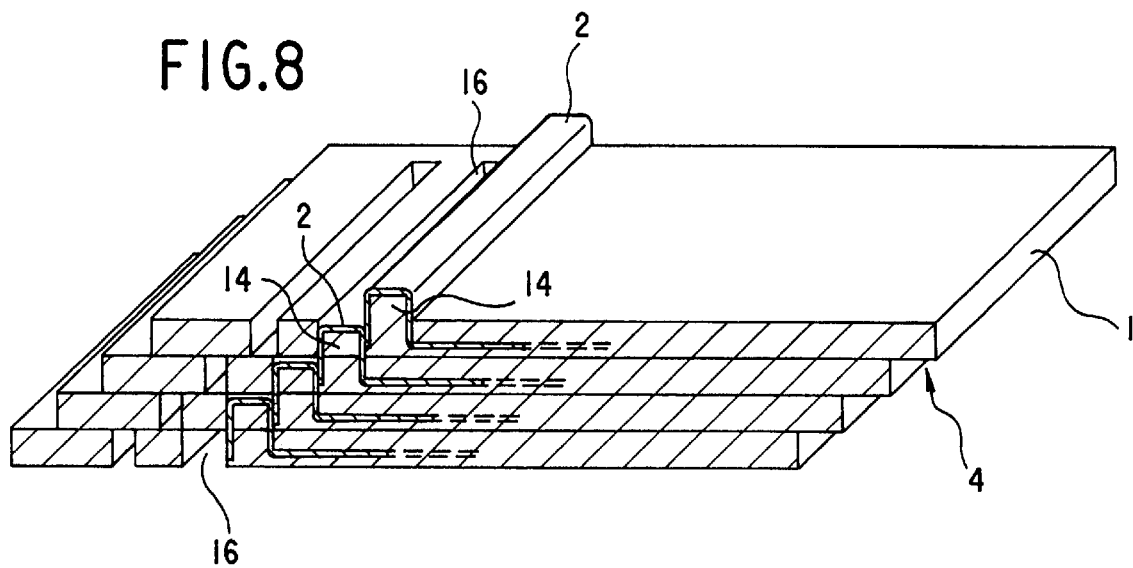
FIG. 8 is a top-perspective, sectional view thereof.

FIGS. 6 to 8 show an embodiment form that can be stacked in step fashion, in which the contact faces 2 lie on at least a part of the surface of at least one projection 14 disposed on one main face 13. At the same time they lie on at least a part of the surface of a corresponding recess 16 disposed immediately next to the recess 14 on the opposite main face 15. The projection 14 of another data carrier 1 can be received in the recess 16. There is a resilient cooperation of the contact faces here insofar as the projections 14 or recesses 16 that are partially occupied by contact faces 2 can and must yield to tolerance when snapped together into a stepped stack. Stepped stack arrangements have the general advantage that they facilitate detachment and they make it easier for the user to externally visualize the number of stacked data carriers.

In particular from the exemplary embodiment according to FIGS. 6 to 8, it is clear that the invention is not limited to data carriers stacked congruently one on top of the other. Also, the contact faces do not have to be disposed congruently one on top of the other in the stack direction. Otherwise, dummy cards or bus amplifying cards or other coupling cards with a corresponding external contour can be incorporated into the stack. A composite unit of this kind is then comprised of a number of data carriers subdivided into at least two groups, wherein the groups are mechanically and electrically connected, for example, by means of an inserted bus amplifier card. The data carriers of the same kind can also be embodied as subunits that can be broken out from larger data carriers that include external connections.

Normally, a data carrier according to the invention includes one or a number of semiconductor circuits 25 disposed in a plane on a flat lead frame. However, it is just as possible to dispose them in two or more planes, wherein the height of the data carriers can be correspondingly chosen so that the individual data carrier has a markedly box-shaped or cubical form. The contacts of each individual plane do not have to be routed outward; instead, the external connections can be collectively made available as one for contacting. Such data carriers, which sharply deviate from the external appearance of known chip cards, can be stacked according to the invention and can be directly contacted by one another.

The general advantage of all embodiments presented herewith is that no further plugging device is necessary. The semiconductor circuits can generally be disposed on a lead frame, a printed circuit board, or a three-dimensional printed circuit board produced by MID (Molded Interconnect Devices) technology. In the latter, the circuit layout is produced in such a way that a connecting body made of various plastics produces a surface that can be selectively metallized.

Figure 9:
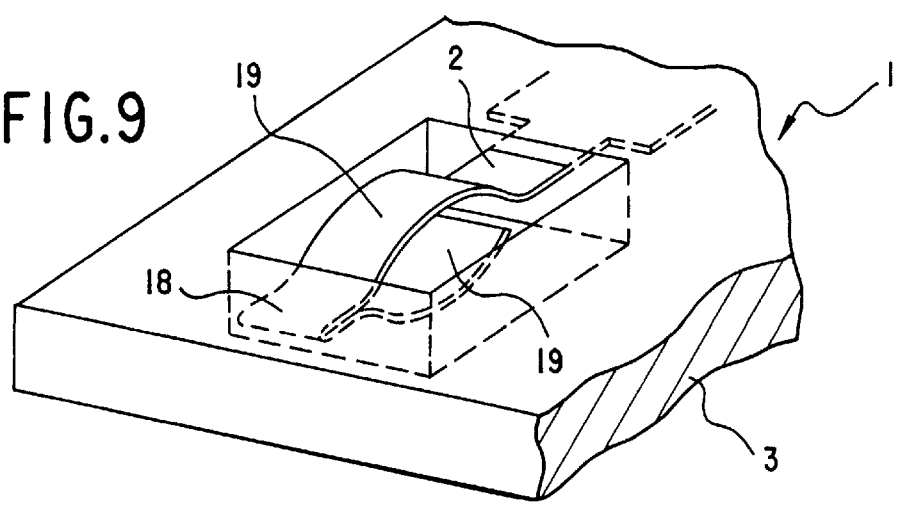
FIG. 9 is a partial top-perspective view of a contact element for use with the stackable data carriers.

FIG. 9 shows a resilient contact element in which the contact faces 2 are inset and partially sunk in a recess in the carrier element 3 of the data carrier. The contact faces can, as indicated, be formed of one piece out of the lead frame and for example, as shown, can have a bending region 18 and coupling regions 19 protruding just above the main faces, respectively oriented in the stacking direction. The bending region 18 can be disposed freely in the recess or injection molded into the carrier element 3. When stacking data carriers, the coupling regions 19 associated with different data carriers reciprocally press into the recesses due to their elasticity.

FIG. 10 shows a contact element in which a folded sheet metal strip 20 has been formed so that it is asymmetrical to the two main faces of the data carrier. While the sheet metal strip 20 toward the bottom has been stamped rigidly downward with a trough shape 21, a roof-like spring tab 22 is produced in the upper part. In accordance with the length, this construction can be sunk in an elongated recess that is open towards the data carrier edge. In the stack, the trough shape 21 that constitutes a contact blade presses on the spring tab 22 of a following contact. If the trough shape 21 is concentrated in the center and is narrower than shown, then two spring tabs 22 that are open toward the center can also be provided in the upper part. The trough shape 21 of a following contact resiliently presses between the tabs. The reciprocal adjustment produces a self-locking contact which can be disposed on the side of a data carrier or inside it. The embodiments according to FIGS. 10 and 11 can be used, for example, when stacking in accordance with the LEGO principle.

FIG. 11 depicts contact faces 2, 24 that are disposed in recesses in the data carrier 1, are elastic in the stacking direction, and are suitable for a stepped stacking arrangement. In contrast to the upper contact face 24 belonging to the data carrier 1 stacked on top of it, the lower contact face 2 that is S-shaped lateral to the stacking direction does not rest against the stop 23 since it is pressed downward by the data carrier 1 stacked on top of it.

In all embodiments, there is the possibility of closing the composite unit, at least toward one side of the stack, by means of a package whose contour on the side of the stack corresponds to the adjoining contour of the data carrier. The contour of the adjoining data carrier is thus used here as a receptacle for a fittingly shaped packaging element that for example can also be embodied so that it can be folded in a V-shape around the stack and can be interlaced on both sides of the stack.

We claim:

1. A stackable and portable data carrier, comprising:

a card-shaped carrier element carrying at least one electrically programmable, non-volatile semiconductor memory and at least one external connector electrically connected to said memory;

said external connector having contact faces disposed on external surfaces of said carrier element such that when respective, substantially identical data carriers rest on one another, said contact faces electrically and physically contact the contact faces of adjacent data carriers;

said carrier element defining a contour of the data carrier which effects a form-lock with adjacent data carriers when a plurality of substantially identical data carriers are stacked on one another, and wherein the data carriers are stackable into a mechanically fixed, but detachable composite unit whereby respectively adjacent data carriers of the composite unit come into contact with one another via said respective contact faces.

2. The data carrier according to claim 1, wherein said carrier element defines two main faces of the data carrier, and wherein said two main faces have a complementary shape such that mutually adjacent data carriers can be snapped together.

3. The data carrier according to claim 1, wherein said contact faces resiliently cooperate with said contact faces of the respectively adjacent data carriers when a plurality of data carriers are assembled into the composite unit.

4. The data carrier according to claim 1, wherein said contact faces effect the electrical contact with adjacent data carriers and at least a part of a mechanical frictional lock with the adjacent data carrier.

5. The data carrier according to claim 1, wherein said carrier element defines two main faces of the data carrier, and wherein one of said main faces is formed with dovetail guides for locking with an adjacent data carrier.

6. The data carrier according to claim 4, wherein said carrier element defines two main faces of the data carrier, and wherein one of said main faces is formed with a projection and the other of said main faces is formed with a complementary recess for receiving a projection of an adjacent data carrier, said contact faces being disposed on at least a part of said projection on at least a part of a surface defining said recess.

7. The data carrier according to claim 1, wherein said carrier element is formed with indentations on an edge face thereof for facilitating detachment of the individual data carrier from the composite unit.

8. The data carrier according to claim 1, wherein said at least one semiconductor memory is one of two semiconductor circuits disposed in two planes above each other within said carrier element, said semiconductor circuits being collectively connected to said contact faces.

9. A composite unit of a plurality of stacked data carriers, comprising:

a plurality of data carriers forming at least two groups of data carriers, each data carrier including a card-shaped carrier element carrying at least one electrically programmable, non-volatile semiconductor memory and at least one external connector electrically connected to said memory;

said external connector of each of said data carriers having contact faces disposed on external surfaces of said carrier element such that when respective data carriers rest on one another, said contact faces electrically and physically contact the contact faces of adjacent data carriers;

said carrier element of each of said data carriers defining a contour of said data carriers which effects a form-lock with adjacent data carriers;

a coupling card having a contour substantially identical to the contour of said data carriers and being disposed between said at least two groups of data carriers;

said contact faces within each of said groups of data carriers being connected to one another and said coupling card connecting said contact faces of adjacent groups of data carriers to one another.

10. The unit according to claim 9, which further comprises a packing structure closing off the composite unit towards at least one side thereof, said packing structure having a contour towards an adjacent said data carrier being complementary to the contour of said data carrier.

* * * * *